United States Patent [19]
D'Oro

[11] 4,383,189
[45] May 10, 1983

[54] CIRCUIT ARRANGEMENT FOR SUMMING THE POWERS OF TWO ISOFREQUENTIAL MICROWAVE SIGNALS

[75] Inventor: Enzo C. D'Oro, Monza, Italy

[73] Assignee: Italtel Societa Italiana Telecomunicazioni S.p.A., Milan, Italy

[21] Appl. No.: 389,975

[22] Filed: Jun. 18, 1982

[30] Foreign Application Priority Data

Jun. 19, 1981 [IT] Italy .................. 22433 A/81

[51] Int. Cl.³ .................. H03G 11/04; H03K 17/26
[52] U.S. Cl. .................. 307/529; 333/18
[58] Field of Search .......... 307/511, 512, 498, 521, 307/529; 328/155; 333/18

[56] References Cited

U.S. PATENT DOCUMENTS

| | | | |
|---|---|---|---|
| 3,013,224 | 12/1961 | King .................. | 333/18 |
| 4,024,460 | 5/1977 | Vifian .................. | 307/511 X |
| 4,308,471 | 12/1981 | Misawa .................. | 307/498 X |
| 4,339,631 | 7/1982 | Nishioka .................. | 307/512 X |
| 4,341,999 | 7/1982 | Rudish et al. .................. | 307/511 X |

Primary Examiner—Donald A. Griffin
Attorney, Agent, or Firm—Karl F. Ross

[57] ABSTRACT

Two microwave signals of identical frequency, possibly differing in amplitude and/or phase from each other, are combined by feeding them to respective inputs of a directional coupler with outputs each carrying an unshifted component of one and a quadrature-shifted component of the other input signal. The composite output signals of the coupler are fed to a hybrid junction which combines them cophasally into a sum signal and with relative phase inversion into a difference signal. The sum signal, besides energizing a load, is applied directly to a reference input of a first coherent detector and through a 90° phase shifter to a reference input of a second coherent detector each receiving the difference signal on a monitoring input. The first detector controls a phase shifter upstream of one of the coupler inputs to correct for phase deviations while the second detector controls a phase shifter downstream of one of the coupler outputs to correct for changes in relative amplitude. The hybrid junction may be a Magic T, or another directional coupler preceded by a 90° phase shifter in series with one of its inputs.

6 Claims, 3 Drawing Figures

CIRCUIT ARRANGEMENT FOR SUMMING THE POWERS OF TWO ISOFREQUENTIAL MICROWAVE SIGNALS

FIELD OF THE INVENTION

My present invention relates to a circuit arrangement for summing the powers of two isofrequential microwave signals possibly differing in amplitude and/or phase from each other.

BACKGROUND OF THE INVENTION

Since the gain of a given amplifier is limited, a desired rate of amplification of a microwave signal often requires the use of two amplifiers connected in parallel whose output signals are then additively combined. These amplifiers are generally connected to respective outputs of a power divider, e.g. a hybrid junction of the Magic-T type, by which they are cophasally energized. If a phase shift should occur in the two signal paths containing these amplifiers, some of the power will be lost in the adder stage. Moreover, a breakdown of either amplifier necessitates its disconnection from the circuit with the aid of switches controlled by signal monitors in the adder. Even with fast-acting electronic switches, however, an unavoidable signal interruption of finite duration will occur during such disconnection.

OBJECT OF THE INVENTION

The object of my present invention, therefore, is to provide an improved circuit arrangement for the purpose set forth which insures an uninterrupted emission of a useful output signal, even in the event of a breakdown in one of the contributing signal paths, and in normal operation supplies the full signal power to a load to be energized.

SUMMARY OF THE INVENTION

Such a circuit arrangement comprises, in accordance with my present invention, a directional coupler with a pair of first input ports which are respectively connected to the two parallel signal paths, this coupler having a pair of first output ports emitting composite signals each including an in-phase signal component from an associated first input port and a quadrature signal component from the respectively opposite input port. The two first output ports are respectively connected to a pair of second input ports of a hybrid junction having a pair of second output ports, this junction combining the received composite signals cophasally into a sum signal on one and with relative phase inversion into a difference signal on the other of the second output ports. A first adjustable phase shifter, inserted upstream of the directional coupler in series with one of the input ports thereof, has a corrective input receiving a first error signal from a first coherent detector which has a reference input connected to the output port carrying the sum signal and which further has a monitoring input connected to the second output port carrying the difference signal. A second adjustable phase shifter, inserted between one of the first output ports and one of the second input ports, has a corrective input receiving a second error signal from a second coherent detector which also has a reference input connected to the output port carrying the sum signal and a monitoring input connected to the output port carrying the difference signal. The first error signal adjusts the upstream phase shifter to correct for phase deviations, in response to a difference signal cophasal with the sum signal, while the second error signal adjusts the downstream phase shifter to correct for changes in relative amplitude, in response to a difference signal in quadrature with the sum signal.

The hybrid junction may be constituted by a Magic T or by an equivalent microwave-guiding structure including, for example, another directional coupler.

BRIEF DESCRIPTION OF THE DRAWING

The above and other features of my invention will now be described in detail with reference to the accompanying drawing in which.

SPECIFIC DESCRIPTION

Figure 1:
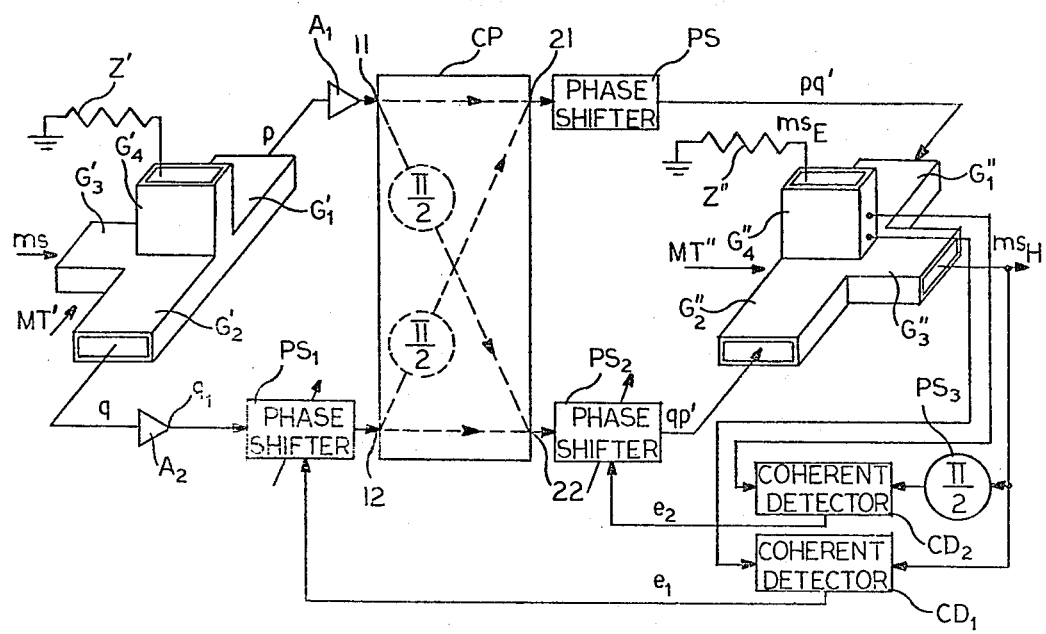
FIG. 1 is a block diagram of a circuit arrangement embodying my invention.

Reference will first be made to FIG. 1 showing a power divider MT' in the form of a Magic T with waveguide sections $G_1'$–$G_4'$. A microwave signal ms is fed to the H-plane guide section $G_3'$ and is split into two components p and q of identical frequency fed to respective amplifiers $A_1$ and $A_2$. The E-plane guide section $G_4'$, connected to a dummy load $Z'$, normally has no output. Amplifier $A_1$ is directly connected to an input port 11 of a directional coupler CP whose other input port 12 is connected to the output of amplifier $A_2$ by way of an adjustable phase shifter $PS_1$. Coupler CP, in the well known manner, has an output port 21 receiving an unshifted signal component from the associated input port 11 and vectorially combines it with a quadrature-shifted signal component from the opposite input port 12; similarly, another output port 22 of coupler CP receives an unshifted signal component from the associated input port 12 and a quadrature-shifted component from the opposite input port 11 for vectorial addition. A composite signal pq' issuing from output port 21 is transmitted via a phase shifter PS to a guide section $G_1''$ of a hybrid junction MT'', constituted by another Magic T, whose companion section $G_2''$ receives a composite signal qp' from coupler output 22 by way of an adjustable phase shifter $PS_2$. Hybrid junction MT'' further has an H-plane guide section $G_3''$, emitting a sum signal $ms_H$, and an E-plane guide section $G_4''$ delivering a difference signal $ms_E$ to a dummy load $Z''$. Two probes extending from guide section $G_4''$ supply that difference signal to monitoring inputs of respective coherent detectors $CD_1$ and $CD_2$; detector $CD_1$ has a reference input directly connected to the output lead of guide section $G_3''$, carrying the useful signal $ms_H$, while a similar reference input of detector $CD_2$ is connected to that same output lead by way of a 90° phase shifter $PS_3$. Error signals $e_1$ and $e_2$, generated by detectors $CD_1$ and $CD_2$, respectively control the upstream phase shifter $PS_1$ and the downstream phase shifter $PS_2$.

Figure 3:
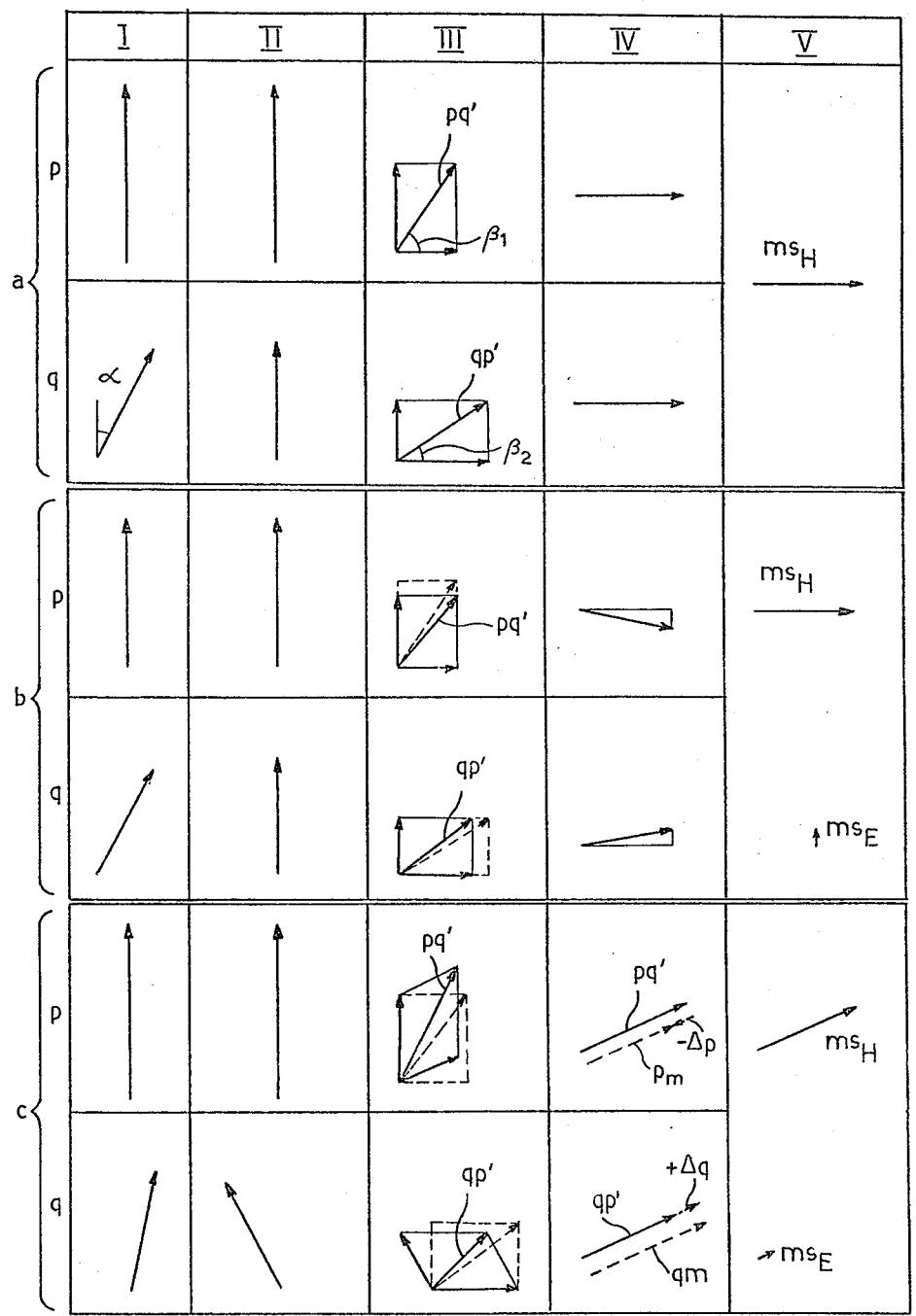
FIG. 3 is a set of vector diagrams serving to explain the mode of operation of the circuitry of FIG. 1 or 2.

Row (a) of FIG. 3 shows the general condition where the two isofrequential microwave signals p and q are of different amplitude and include a phase angle $\alpha$ with each other upon issuing from the outputs of amplifiers $A_1$ and $A_2$; see column I. With proper adjustment of phase shifter $PS_1$, as represented in column II, these signals reach the inputs 11 and 12 of coupler CP still with different amplitudes but in phase with each other.

The composite signals pq' and qp' emitted at outputs 21 and 22 of the coupler, as depicted in column III, are of identical amplitudes while including respective phase angles $\beta_1$ and $\beta_2$ with a reference vector here arbitrarily assumed to be in quadrature with the signals of column II. Just as arbitrarily, phase shifter PS is assumed to rotate the signal pq' from coupler output 21 into a phase position, illustrated in column IV, corresponding to that reference vector with which the signal is fed to input port $G_1''$ of component MT''. While this phase shifter PS is not absolutely necessary, it is essential that phase shifter $PS_2$ feeds the signal qp' cophasally with signal pq' to the input port $G_2''$ of the Magic T. Under these circumstances the two signals, whose amplitude is still the same, are combined into a sum signal $ms_H$ at twice their power which issues from guide section $G_3$ and energizes a nonillustrated load; as will be apparent from column V, no difference signal $ms_E$ is emitted under these circumstances by guide section $G_4''$.

Let us consider, now, a change in the relative amplitudes of signals p and q as represented in row (b) of FIG. 3; see column I. In the position of column II, i.e. after passage of signal q through phase shifter $PS_1$, the two signals are again in phase with each other. Column III shows in full lines the resulting composite signals pq', qp' and in dotted lines, for comparison, the signals appearing in the same column in row (a). Since their phase angles $\beta_1$ and $\beta_2$ have changed in opposite directions, signals pq' and qp' are no longer in phase after traversing the respective shifters PS and $PS_2$; thus, as indicated in column IV, they have minor components perpendicular to the reference vector giving rise to a small difference signal $ms_E$ accompanied by a sum signal $ms_H$ of somewhat reduced amplitude as shown in column V. Signal $ms_H$, rotated into a quadrature position by the phase shifter $PS_3$ of FIG. 1, is fed to the reference input of coherent detector $CD_2$ which simultaneously receives the difference signal $ms_E$ on its monitoring input. A resulting error signal $e_2$, representing the amplitude of the difference signal during peak periods of the sum signal, is fed to the control input of phase shifter $PS_2$ which thereupon returns the signal qp' to its cophasal relationship with signal pq'.

Row (c) of FIG. 3 represents the situation in which the phase angle between the amplified signals p and q has changed from the value $\alpha$ shown in row (a) and column I. The corrective action of phase shifter $PS_1$, therefore, no longer aligns their vectors with each other as indicated in column II. As seen in column III, where the vectors of row (a) have again been represented in dotted lines for the sake of comparison, the composite signals pq', qp' issuing from coupler CP are now of significantly different amplitudes even though their relative phase has remained unchanged. These different amplitudes can be treated as the algebraic sums of a mean vector $P_m$ and a difference vector $-\Delta p$ in the case of the smaller signal pq' and a mean vector $q_m$ and a difference vector $+\Delta q$ in the case of the larger signal qp', as shown in column IV. The two mutually identical mean vectors $P_m$ and $q_m$ add up to the sum signal $ms_H$, column V, while the oppositely oriented two difference vectors $-\Delta p$ and $+\Delta p$ (also of like magnitudes) give rise to a difference signal $ms_E$ in phase with the sum signal. Thus, the coherent detector $CD_1$ generates an error signal $e_1$ in response to the coincidence of signals $ms_H$ and $ms_E$, this error signal readjusting the phase shifter $PS_1$ to restore the cophasality of signals p and q at the input ports 11 and 12 of coupler CP. In the case of a simultaneous shift in relative phase and amplitude, of course, both phase shifters $PS_1$ and $PS_2$ will intervene in response to the concurrently generated error signals $e_1$ and $e_2$.

The 90° phase shifter $PS_3$ could be relocated from detector $CD_2$ to detector $CD_1$ if these detectors measure the amplitude of the monitored difference signal $ms_E$ at the instants when the sum signal $ms_H$ applied to their reference inputs goes through zero. Alternatively, such a phase shifter may be inserted in one of the leads extending from guide section $G_4''$ to the monitoring inputs of these detectors. The phase shifter can be omitted if detectors $CD_1$ or $CD_2$ are respectively timed by zero crossings and peaks of the sum signal.

If an instantaneous breakdown occurs in one of the amplifiers $A_1$, $A_2$, or if the output level of that amplifier drops below a predetermined minimum threshold in less than the response time of the phase-correcting circuits, components of the output signal of the intact amplifier will still appear in relative quadrature at the coupler outputs 21 and 22. This will temporarily give rise to a difference signal $ms_E$ in quadrature with sum signal $ms_H$, as shown in row (b) and column V of FIG. 3. Even before that difference signal has caused any readjustment of phase shifter $PS_2$, as described above, the sum signal $ms_H$ will keep the load energized albeit with reduced amplitude. In contrast to the mode of operation of conventional switching systems, therefore, no interruption in load current will occur.

Figure 2:
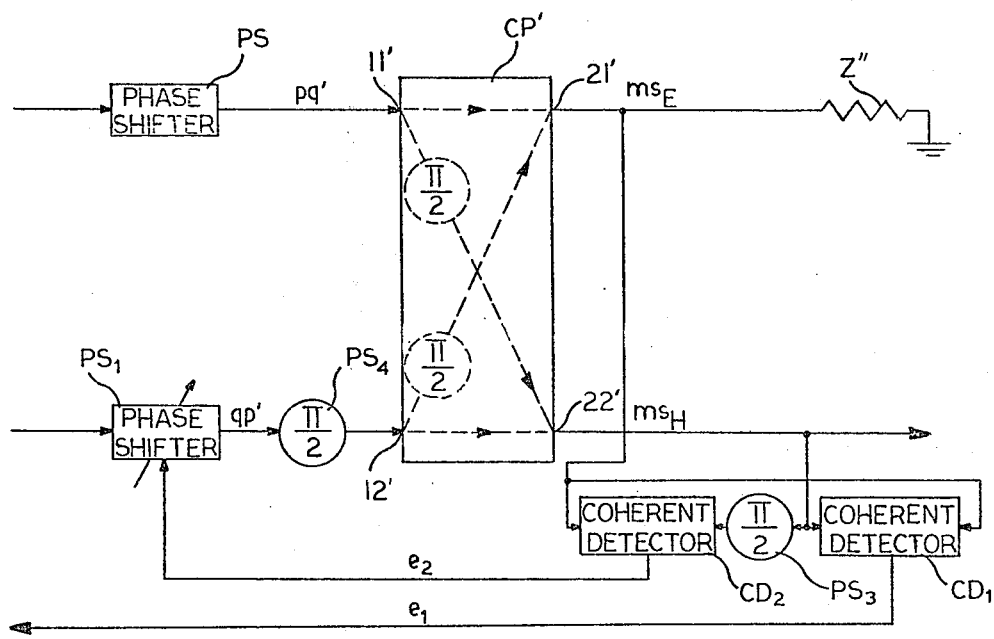
FIG. 2 is a block diagram showing a partial modification of the embodiment of FIG. 1.

The hybrid junction MT'' represented by a Magic T in the system of FIG. 1 can be replaced by equivalent circuitry, e.g. by another directional coupler CP' as shown in FIG. 2. There the composite signal pq' issuing from phase shifter PS is applied directly to an input port 11' of this coupler CP' whose other input port 12' receives the companion signal qp' by way of a 90° phase shifter $PS_4$. By virtue of the quadrature shift occurring in the internal cross-connections of coupler CP', its output port 21' associated with input port 11' emits the difference signal $ms_E$ while the useful sum signal $ms_H$ is emitted by the output port 22' associated with input port 12'. Signal $ms_E$, as before, is fed to a dummy load Z'' and to monitoring inputs of coherent detectors $CD_1$, $CD_2$ whose reference inputs receive the sum signal $ms_H$, again with interposition of a 90° phase shifter $PS_3$ in the case of detector $CD_2$. The mode of operation of these two detectors, generating error signals $e_1$ and $e_2$, is the same as in the system of FIG. 1. Phase shifter $PS_4$, shown in cascade with phase shifter $PS_3$, could be combined with the latter into a single component.

The isofrequential signals p and q to be combined by my present circuit arrangement may, of course, be supplied by sources other than the two amplifiers $A_1$ and $A_2$ shown in FIG. 1 and need not, nominally, be of the same amplitude and phase. If the required phase corrective exceeds the range of available phase adjusters, these adjusters could be cascaded with fixed phase shifters serving as preadjusters.

I claim:
1. A circuit arrangement for summing the powers of two isofrequential microwave signals, comprising:
 a first and a second signal path carrying respective microwave signals of identical frequency to be combined;
 a directional coupler with a pair of first input ports respectively connected to said signal paths and with a pair of first output ports emitting composite signals each including an in-phase signal compo- nent from an associated first input port and a quadrature signal component from the respectively opposite first input port;

a hybrid junction with a pair of second input ports respectively connected to said first output ports and with a pair of second output ports, said hybrid junction combining said composite signals cophasally into a sum signal on one second output port and with relative phase inversion into a difference signal on the other second output port, said sum signal being available for the energization of a load;

a first adjustable phase shifter upstream of said directional coupler in series with one of said first input ports;

a second adjustable phase shifter inserted between one of said first output ports and one of said second input ports;

a first coherent detector with a reference input connected to said one second output port and with a monitoring input connected to said other second output port for emitting a first error signal to a corrective input of said first adjustable phase shifters in response to a difference signal in phase with said sum signal; and a second coherent detector with a reference input connected to said one second output port and with a monitoring input connected to said other second output port for emitting a second error signal to a corrective input of said second adjustable phase shifters in response to a difference signal in quadrature with said sum signal.

2. A circuit arrangement as defined in claim 1 wherein said hybrid junction comprises a Magic T.

3. A circuit arrangement as defined in claim 1 wherein said hybrid junction comprises another directional coupler preceded by 90° phase-shifting means in series with one of said second input ports.

4. A circuit arrangement as defined in claim 3 wherein said 90° phase-shifting means is part of said second adjustable phase shifter.

5. A circuit arrangement as defined in claim 1, 2, 3 or 4 wherein said signal paths comprise a pair of amplifiers connected to respective outputs of a power divider.

6. A circuit arrangement as defined in claim 1, 2, 3 or 4 wherein said coherent detectors are substantially identical, further comprising a 90° phase shifter inserted in the connection between an input of one of said coherent detectors and one of the output ports of said hybrid junction.

* * * * *